(12) United States Patent
Hosokawa

(10) Patent No.: US 7,763,862 B2
(45) Date of Patent: Jul. 27, 2010

(54) METHOD OF ABERRATION CORRECTION AND ELECTRON BEAM SYSTEM

(75) Inventor: Fumio Hosokawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 349 days.

(21) Appl. No.: 11/847,595

(22) Filed: Aug. 30, 2007

(65) Prior Publication Data

US 2008/0054186 A1    Mar. 6, 2008

(30) Foreign Application Priority Data

Aug. 31, 2006    (JP) .............................. 2006-234924

(51) Int. Cl.
G21K 1/08    (2006.01)
(52) U.S. Cl. ............................. 250/396 R; 250/396 ML
(58) Field of Classification Search .................. None
See application file for complete search history.

(56) References Cited

U.S. PATENT DOCUMENTS

| | | | |
|---|---|---|---|
| 4,962,313 A * | 10/1990 | Rose | 250/311 |
| 6,555,818 B1 * | 4/2003 | Hosokawa | 250/311 |
| 6,646,267 B1 | 11/2003 | Haider et al. | |
| 6,836,373 B2 | 12/2004 | Hosokawa | |
| 2004/0036030 A1 * | 2/2004 | Matsuya et al. | 250/396 R |
| 2004/0155200 A1 * | 8/2004 | Muller et al. | 250/396 R |
| 2004/0227099 A1 * | 11/2004 | Matsuya | 250/398 |
| 2007/0085033 A1 * | 4/2007 | Buller et al. | 250/492.1 |
| 2008/0283749 A1 * | 11/2008 | Muller et al. | 250/311 |

FOREIGN PATENT DOCUMENTS

JP    2003-92078    3/2003

* cited by examiner

Primary Examiner—Bernard E Souw
Assistant Examiner—Andrew Smyth
(74) Attorney, Agent, or Firm—The Web Law Firm

(57) ABSTRACT

There is disclosed an electron beam system in which the third-order aberration $S_3$ with two-fold symmetry is corrected. If a $C_s$ corrector is operated, parasitic aberration $S_3$ (third-order aberration $S_3$ with two-fold symmetry) is produced. A corrective third-order aberration $S_3'$ with two-fold symmetry that cancels out the parasitic aberration $S_3$ is produced within a multipole element to correct the parasitic aberration $S_3$. The electron beam is tilted relative to the optical axis within the multipole element producing a hexapole field. The corrective third-order aberration $S_3'$ with two-fold symmetry is introduced in each electron forming the tilted electron beam.

8 Claims, 4 Drawing Sheets

METHOD OF ABERRATION CORRECTION AND ELECTRON BEAM SYSTEM

BACKGROUND OF THE INVENTION

1. Field of the Invention

The present invention relates to an electron beam system equipped with a spherical aberration corrector.

2. Description of Related Art

Some modern transmission electron microscopes are equipped with a spherical aberration corrector ($C_s$ corrector). The $C_s$ corrector is used to correct spherical aberration ($C_s$) in an objective lens or the like. One known type of this $C_s$ corrector comprises two multipole elements and transfer lenses disposed between the multipole elements (axisymmetric lens) (see, for example, Japanese Patent Laid-Open No. 2003-92078. Each of the multipole elements produces a hexapole field.

Spherical aberration ($C_s$) in an objective lens is corrected by such a $C_s$ corrector. However, placing the $C_s$ corrector produces new aberrations (known as parasitic aberrations). Produced parasitic aberrations of the third or less orders include first-order aberration (A1) with two-fold symmetry, second-order aberration (B2) with one-fold symmetry, second-order aberration (A2) with three-fold symmetry, third-order aberration (S3) with two-fold symmetry, and third-order aberration (A3) with four-fold symmetry. It is required that all of these five parasitic aberrations be corrected.

A method of correcting A1, B2, A2, and A3 of these five aberrations is already known. That is, the aberrations A1, A2, and A3 can be corrected if an electrostatic pole element or magnetic quadrupole element, a hexapole element, and an octopole element are respectively used. The aberration B2 can be corrected by utilizing a variation in the electronic orbit caused by a deflection coil. Correction of B2 is also known as coma-free alignment, which was already known prior to achievement of a $C_s$ corrector.

Correction of the aberration $S_3$ has been required by achievement of correction of $C_s$. However, any method of making this correction has not been concretely established yet, for the following reason. The aberration $S_3$ originates from the fringing term of the quadrupole field. That is, the aberration $S_3$ depends on the term of the quadrupole field differentiated twice by a parameter Z that is the amount of motion of electrons in the direction of motion. Consequently, it is impossible to directly control the aberration using electrostatic or magnetic n-pole elements. The aberration $S_3$ can be corrected by generating and annihilating the fringing term of the quadrupole field at will. Another available method uses an off-axis aberration as $S_3$-correcting means, the off-axis aberration being produced by causing the trajectory of electrons to pass off the optical axis of the optical system (U.S. Pat. No. 6,646,267). However, many other low-order aberrations other than $S_3$ are produced outside the axis. Consequently, the concomitantly produced aberrations other than the intended aberration used mainly to correct $S_3$ produce great adverse effects. Hence, it is not easy to control the system.

SUMMARY OF THE INVENTION

Accordingly, it is an object of the present invention to provide a method and an electron beam system for correcting the third-order aberration $S_3$ with two-fold symmetry by controlling the fringing term of a quadrupole field on the axis.

A method of correcting aberrations in accordance with one embodiment of the present invention is implemented with an electron beam system equipped with a spherical aberration corrector having a first multipole element, a second multipole element, and transfer lenses disposed between the multipole elements. This method consists of tilting the center orbit of the electron beam within the first or second multipole element relative to the optical axis such that the third-order aberration ($S_3$) with two-fold symmetry is corrected. Consequently, electrons pass through the quadrupole field whose intensity varies dependently on their degree of progress within the multipole element. That is, the electrons are affected by the fringing term of the quadrupole field, producing $S_3'$. The tilt of the electrons within the multipole element is controlled such that the produced $S_3'$ cancels out the aberration $S_3$ in the whole optical system. Furthermore, in the present invention, a deflection means is provided to deflect the electrons back to the optical axis after the electrons exit from the multipole element. As a result, the tilt of the electron trajectory is restricted within the multipole element. The electrons are not affected by factors or circumstances outside the axis of the optical system.

Accordingly, the present invention makes it possible to correct the third-order aberration $S_3$ with two-fold symmetry.

Other objects and features of the invention will appear in the course of the description thereof, which follows.

DESCRIPTION OF THE PREFERRED EMBODIMENTS

Embodiments of the present invention are hereinafter described with reference to the accompanying drawings.

Figure 1:
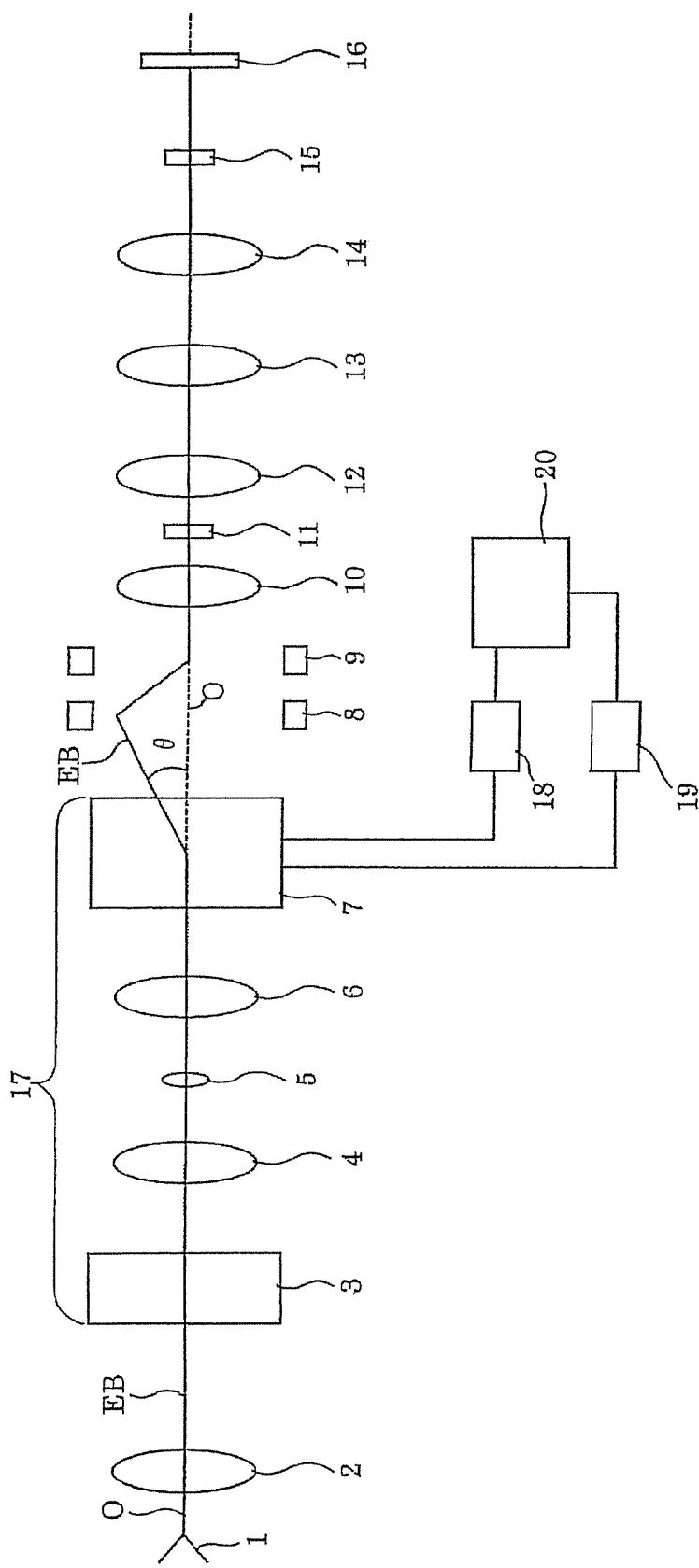
FIG. 1 is a diagram illustrating an electron beam system according to one embodiment of the present invention.

FIG. 1 shows a transmission electron microscope to which the principle of the present invention is applied. The structure of the instrument is first described.

The microscope has an electron gun 1. Disposed in order behind the gun 1 along the optical axis O are a condenser lens 2, a first multipole element 3, a transfer lens 4, another transfer lens 5, a further transfer lens 6, a second multipole lens 7, a deflection coil 8, another deflection coil 9, an objective lens 10, a specimen 11, another objective lens 12, an intermediate lens 13, a projector lens 14, a detector 15 for STEM imaging, and a fluorescent screen 16. The axes of these magnetic lenses 2-10 and 12-14 are aligned with the optical axis O.

Figure 2:
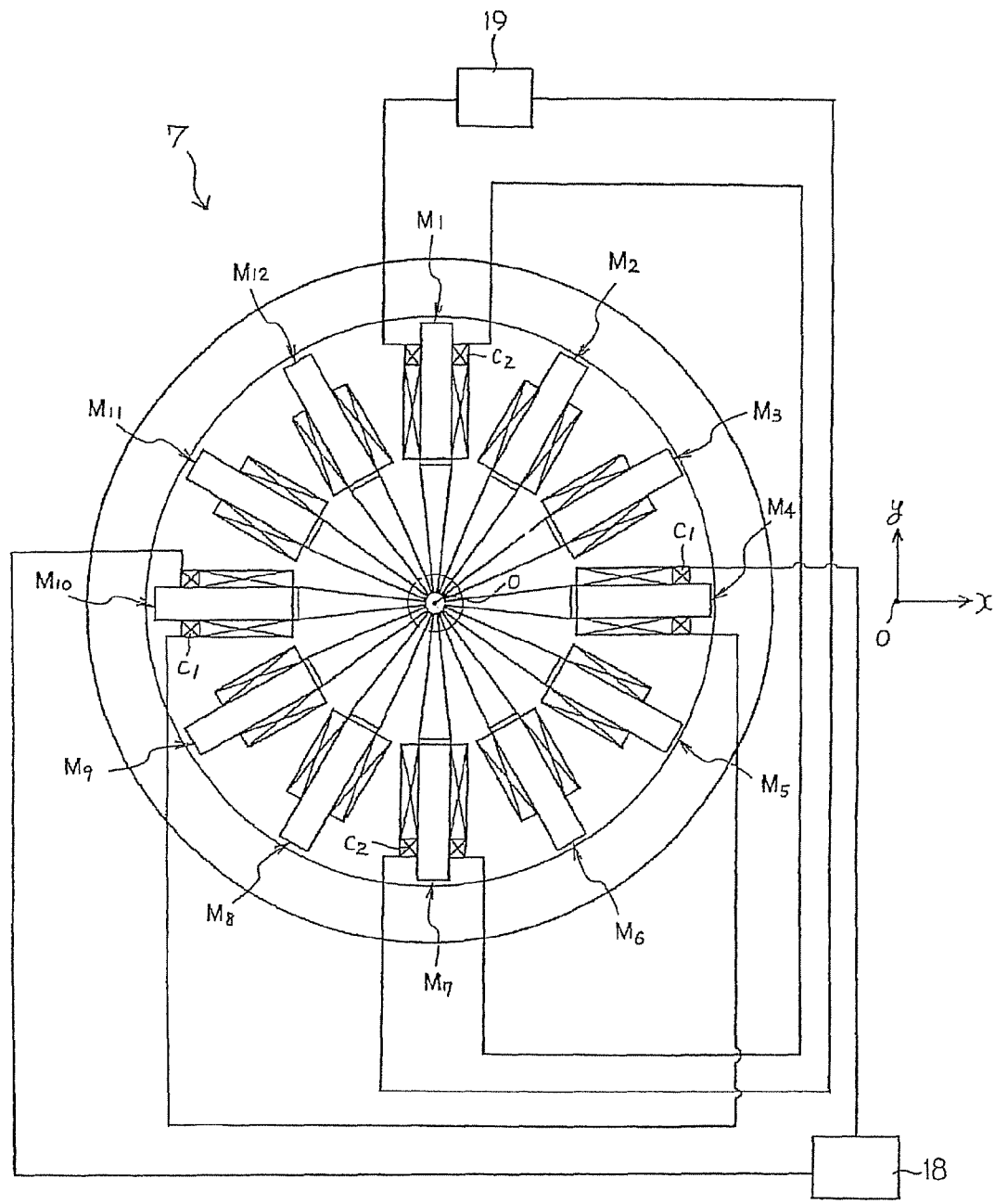
FIG. 2 is a diagram showing the structure of one multipole element used in the electron beam system shown in FIG. 1.

The $C_s$ corrector 17 is composed of the multipole element 3, transfer lenses 4-6, and multipole lens 7. The multipole elements 3 and 7 are placed in a conjugate relationship using the transfer lenses 4-6. Each of the multipole elements 3 and 7 produces a hexapole field to correct the aberration $C_s$. In this embodiment, each of the multipole elements 3 and 7 is made up of 12 magnetic poles $M_1$-$M_{12}$ placed symmetrically with respect to the optical axis O. FIG. 2 is a view of the second multipole element 7 as viewed from a side of the transfer lens 6. Various methods are available to produce a hexapole field by means of a dodecapole (12-pole) element in this way. In one method, a hexapole field for correcting the aberration $C_s$ is produced using 12 magnetic poles. In another method, a hexapole field for correcting the aberration $C_s$ is produced using six magnetic poles spaced apart from each other by 60°. The transfer lens 5 in the $C_s$ corrector is the rotation-correcting lens described in the above-cited Japanese Patent Laid-Open No. 2003-92078. This lens is used to correct the rotational relationship between the hexapole field produced by the first multipole element 3 and the hexapole field produced by the multipole element 7.

Referring still to FIG. 1, an excitation current source 18 is used for deflection in the X-direction. This current source 18 supplies an exciting current to a coil $C_1$ wound commonly around the magnetic poles $M_4$ and $M_{10}$ as shown in FIG. 2. When the coil $C_1$ is excited with the current in this way, an X-deflection field is produced between the magnetic poles $M_4$ and $M_{10}$. An electron beam traveling on and near the optical axis O is deflected in the X-direction by the X-deflection field. The coil $C_1$ is wound around the magnetic poles $M_4$ and $M_{10}$ independent of the other coils.

Referring also to FIG. 1, an excitation current source 19 is used for deflection in the Y-direction. This current source 19 is used to supply an exciting current to a coil $C_2$ wound commonly around the magnetic poles $M_1$ and $M_7$ as shown in FIG. 2. When the coil $C_2$ is excited with the current in this way, a Y-deflection field is produced between the magnetic poles $M_1$ and $M_7$. An electron beam traveling on and near the optical axis O is deflected in the Y-direction by the Y-deflection field. The coil $C_2$ is wound around the magnetic poles $M_1$ and $M_7$ independent of the other coils.

Referring still to FIG. 1, a control means 20 controls the excitation current source 18 for X-direction deflection and the excitation current source 19 for Y-direction deflection.

The structure of the instrument shown in FIG. 1 has been described so far. The first deflection means of the present invention is formed by the magnetic poles $M_4$, $M_{10}$, coil $C_1$, excitation current source 18 for X-direction deflection, magnetic poles $M_1$, $M_7$, coil $C_2$, and excitation current source 19 for Y-direction deflection (see also FIG. 2) in the instrument shown in FIG. 1. The second deflection means of the present invention is formed by the deflection coils 8 and 9 in the instrument shown in FIG. 1. The deflection coils 8 and 9 can deflect the electron beam in the X- and Y-directions.

The operation of the transmission electron microscope of FIG. 1 is described below. An electron beam EB generated by the electron gun 1 is focused by the condenser lens 2, passes along the optical axis O, and enters the $C_s$ corrector 17. Spherical aberration ($C_s$) in the objective lens 10 is corrected by the $C_s$ corrector, i.e., by the hexapole field produced by the multipole elements 3 and 7.

When the $C_s$ corrector 17 is operated, the aforementioned parasitic aberration $S_3$ (third-order aberration $S_3$ with two-fold symmetry) is produced. Accordingly, in the instrument shown in FIG. 1, a new third-order aberration ($S_3'$) with two-fold symmetry is produced within the second multipole element 7 to cancel out the parasitic aberration $S_3$. Thus, the parasitic aberration $S_3$ is corrected.

In particular, the electron beam EB hitting the second multipole element 7 along the optical axis O is deflected a given amount in a given direction by the X-deflection field produced between the magnetic poles $M_4$ and $M_{10}$ of the second multipole element 7 and by the Y-deflection field produced between the magnetic poles $M_1$ and $M_7$ of the multipole element 7. As a result of this deflection, the center orbit of the electron beam EB hitting the second multipole element 7 along the optical axis is tilted at an angle of θ relative to the optical axis O within the second multipole element 7 producing the $C_s$-correcting hexapole field.

When the electron beam EB is tilted relative to the optical axis O within the second multipole element 7 producing the hexapole field in this way, the third-order aberration ($S_3'$) with two-fold symmetry is introduced in each electron forming the tilted electron beam EB within the multipole element 7. That is, during the process in which the tilted electron beam EB travels through the multipole element 7, the corrective third-order aberration ($S_3'$) with two-fold symmetry independent of the parasitic aberration $S_3$ is produced for each electron. This has been experimentally found by us. In the instrument shown in FIG. 1, the corrective aberration $S_3'$ is produced to cancel out the parasitic aberration $S_3$. Consequently, the parasitic aberration $S_3$ is corrected.

To create the corrective aberration $S_3'$ for canceling out the parasitic aberration $S_3$, it is necessary that the magnitude and phase angle (direction) of the corrective aberration $S_3'$ can be varied at will. With respect to this requirement, we have experimentally discovered the following facts (1) and (2):

(1) The magnitude of the corrective aberration $S_3'$ depends on the degree of the tilt of the electron beam EB within the multipole element 7. As the angle of tilt θ shown in FIG. 1 is increased, the magnitude of the produced corrective aberration $S_3'$ increases. That is, in the second multipole element 7 shown in FIG. 2, the magnitude of the produced corrective aberration $S_3'$ varies dependently on the extent to which the electron beam EB hitting the second multipole element 7 along the optical axis O is deflected outwardly by the deflection magnetic poles $M_4$, $M_{10}$, $M_1$, and $M_7$.

(2) The phase angle of the corrective aberration $S_3'$ depends on the direction of tilt of the electron beam EB within the multipole element 7. That is, in the second multipole element 7 shown in FIG. 2, the phase angle of the produced corrective aberration $S_3'$ is affected by the direction in which the electron beam EB hitting the second multipole element 7 along the optical axis is deflected by the deflection magnetic poles $M_4$, $M_{10}$, $M_1$, and $M_7$.

Accordingly, in the instrument shown in FIG. 1, the control means 20 sends a control signal T for producing the corrective aberration $S_3'$ for canceling out the parasitic aberration $S_3$ within the second multipole element 7 to the excitation current source 18 for X-direction deflection and to the excitation current source 19 for Y-direction deflection. The control signal T indicates the direction and extent of tilt of the electron beam EB within the multipole element 7. The excitation current sources 18 and 19 for X- and Y-direction deflections control the electrical currents flowing through the coils C1 and C2 (see FIG. 2) based on the control signal T. Consequently, an X-deflection field corresponding to the control signal T is produced between the magnetic poles $M_4$ and $M_{10}$. Also, a Y-deflection field corresponding to the control signal T is produced between the magnetic poles $M_1$ and $M_7$.

The electron beam EB hitting the second multipole element 7 along the optical axis is tilted by the X-deflection field and Y-deflection field to produce the corrective aberration $S_3'$ for canceling out the parasitic aberration $S_3$ within the second multipole element 7 (see FIG. 1). The electron beam EB going out of the second multipole element 7 is deflected back to the optical axis O by the deflection coils 8 and 9. The beam EB enters the objective lens 10 along the optical axis. The beam EB exiting from the objective lens 10 impinges on a specimen 11.

The control signal T has been previously found and set into the control means 20. As an example, the control signal T can be found by the following method. When the specimen 11 is not yet set, the shape of the spot of the electron beam EB is observed on a fluorescent screen 16. The excitation current source 18 for the X-direction deflection and the excitation current source 19 for the Y-direction deflection are controlled such that the shape of the spot of the observed electron beam EB assumes a circular form, i.e., parasitic aberration $S_3$ in the whole optical system is reduced down to zero. In this way, the extent and direction of the tilt of the electron beam EB are set.

The operation of the instrument shown in FIG. 1 has been described so far. As described previously, in the instrument of FIG. 1, the parasitic aberration $S_3$ is corrected together with the spherical aberration ($C_s$) in the objective lens 10. Therefore, the diameter of the electron beam EB hitting the specimen 11 can be made very small. Consequently, high-resolution STEM imaging is enabled. Furthermore, microscopic areas can be analyzed, for example, employing the characteristic X-rays.

Generation of the corrective aberration $S_3'$ is now described supplementarily. As shown in FIG. 1, the electron beam EB incident on the second multipole element 7 along the optical axis O gradually moves away from the axis O when the beam travels through the multipole element 7. At this time, the $C_s$-correcting hexapole field is produced within the second multipole element 7 and so the electrons gradually move away from the optical axis O while being affected by the hexapole field. Under this condition, the electrons are increasingly affected by the quadrupole field in going through the multipole element 7. This is equivalent to the situation in which the electrons are affected by the fringing term of the quadrupole field within the multipole element 7. As a result, corrective aberration $S_3'$ (third-order aberration with two-fold symmetry) is introduced in electrons traveling through the second multipole element 7 at an angle to the optical axis O. If the electron beam EB is tilted relative to the optical axis O within the multipole element 7, new first-order aberration A1 with two-fold symmetry is also produced together with the aberration $S_3'$. In the instrument of FIG. 1, the aberration A1 is corrected, for example, by an existing stigmator coil (not shown).

Figure 3:
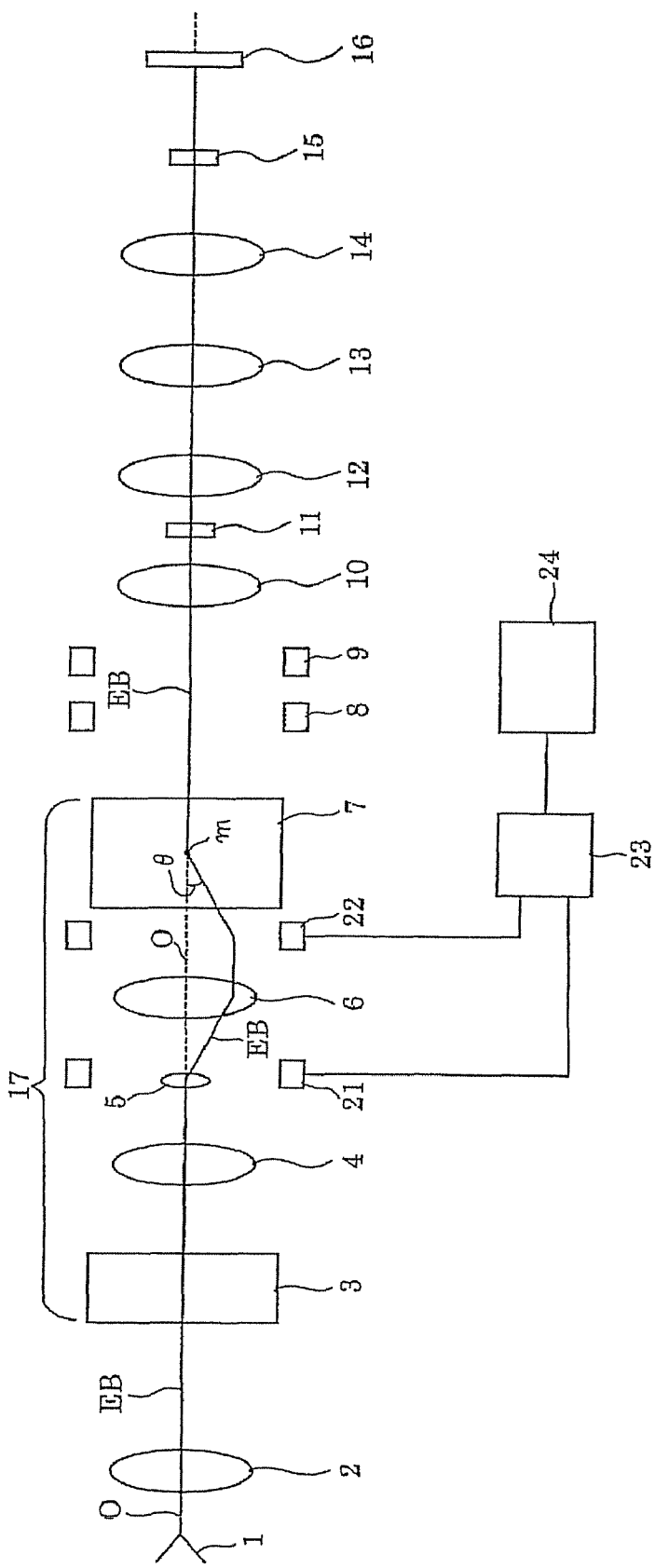
FIG. 3 is a diagram illustrating an electron beam system according to another embodiment of the present invention.

Another embodiment of the present invention is next described by referring to FIG. 3. Note that like components are indicated by like reference numerals in both FIGS. 1 and 3 and that those components which have been already described will not be described below.

Referring to FIG. 3, a deflection coil 21 is disposed between transfer lenses 4 and 6. Another deflection coil 22 is disposed between the transfer lens 6 and a multipole element 7. The deflection coils 21 and 22 are designed to be able to deflect the electron beam EB in the X- and Y-directions, respectively.

An excitation current source 23 supplies an excitation current to the deflection coils 21 and 22 under control of a control means 24. The operation of the transmission electron microscope of this structure is described below.

In the instrument of FIG. 3, corrective aberration $S_3'$ is produced within the second multipole element 7 in the same way as in the instrument of FIG. 1. However, in the instrument of FIG. 3, the electron beam EB is deflected by the deflection coils 21 and 22 such that the electron beam EB is incident at an angle of θ to the optical axis O passing through the second multipole element 7 (i.e., to the midpoint m of the second multipole element 7). Because the electron beam EB enters at an angle to the second multipole element 7 in this way, corrective aberration $S_3'$ is introduced in electrons traveling through the second multipole element 7 at an angle to the optical axis O in the same way as in the instrument of FIG. 1. In the instrument shown in FIG. 3, the direction of incidence of the electron beam EB on the second multipole element 7 and the angle of incidence are controlled to produce corrective aberration $S_3'$ that cancels out the parasitic aberration $S_3$.

Control signals regarding the direction and angle of the incidence are supplied from the control means 24 to the deflection excitation current source 23. The current source 23 controls the currents flowing through the deflection coils 21 and 22 based on the control signals.

In the instrument of FIG. 3, the deflection coils 21, 22 and the deflection excitation current source 23 together form "first deflection means." The electron beam EB obliquely incident on the second multipole element 7 is deflected back to the optical axis O by the XY-deflecting field created by the magnetic poles $M_1$, $M_4$, $M_7$, and $M_{10}$ of the second multipole element 7 (second deflection means). The electron beam EB enters the objective lens 10 along the optical axis.

Figure 4:
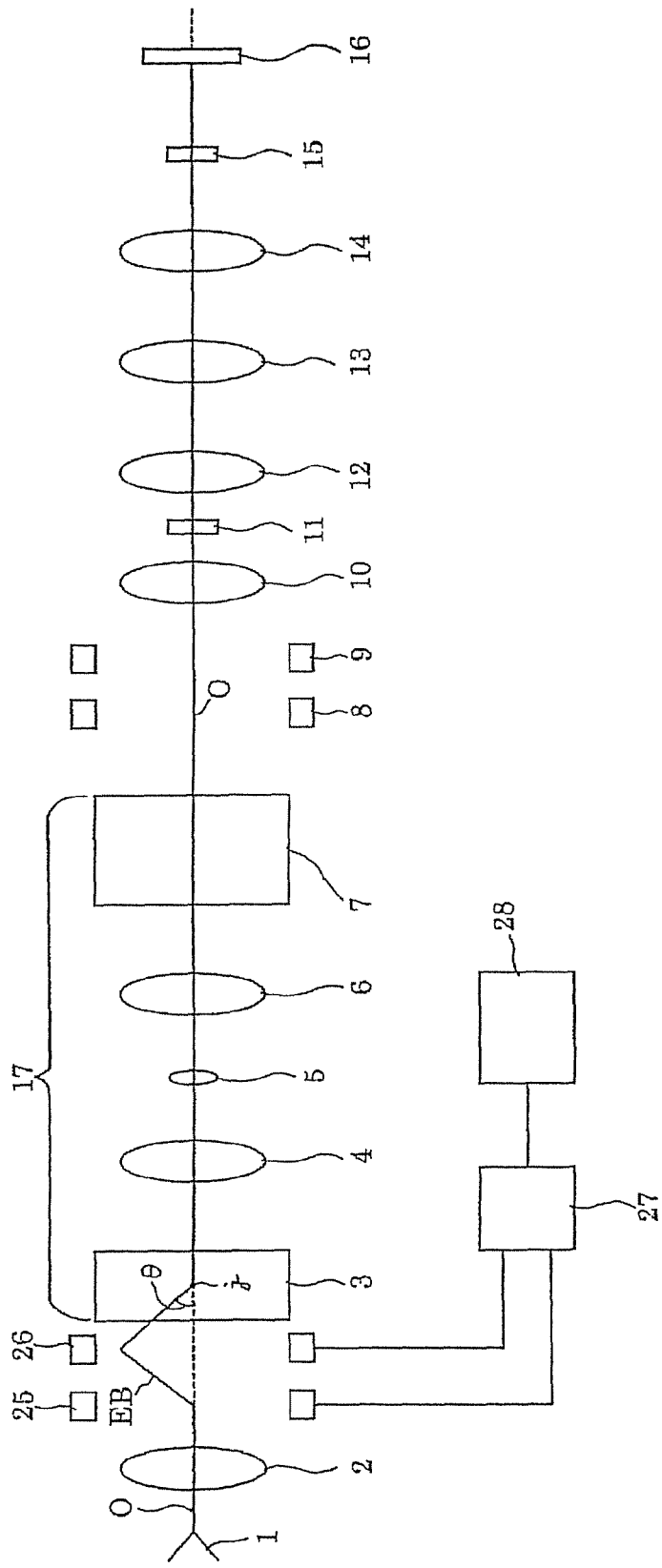
FIG. 4 is a diagram illustrating an electron beam system according to a further embodiment of the present invention.

A further embodiment of the present invention is next described by referring to FIG. 4. In both FIGS. 1 and 4, like components are indicated by like reference numerals. Those components which have been already described will not be described below.

In FIG. 4, deflection coils 25 and 26 are disposed between a condenser lens 2 and the multipole element 3. The deflection coils 25 and 26 are designed to be capable of deflecting the electron beam EB in the X- and Y-directions, respectively.

An excitation current source 27 for deflection supplies excitation currents to the deflection coils 25 and 26 under control of a control means 28.

The operation of the transmission electron microscope of this structure is described below. In the above-described instruments of FIGS. 1 and 3, corrective aberration $S_3'$ was produced within the multipole element 7. In the instrument of FIG. 4, corrective aberration $S_3'$ is produced within the multipole element 3. That is, the deflection beam EB is deflected by the deflection coils 25 and 26 such that the beam EB impinges at an angle of θ to the optical axis O (to the midpoint j of the multipole element 3) passing through the first multipole element 3 in the instrument of FIG. 3. When the beam EB enters the first multipole element 3 at an angle in this way, corrective aberration $S_3'$ is introduced in the electrons traveling through the first multipole element 3 at an angle to the optical axis O in the same way as in the instrument of FIG. 3. In the instrument of FIG. 4, the direction and angle of incidence of the electron beam EB on the first multipole element 3 are controlled to produce corrective aberration $S_3'$ that cancels out the parasitic aberration $S_3$. Control signals regarding the direction and angle of incidence are supplied from the control means 28 to the excitation current source 27 for deflection. The current source 27 controls the currents flowing through the deflection coils 25 and 26 based on the control signals.

In the instrument of FIG. 4, the deflection coils 25, 26 and excitation current 27 together form the "first deflection means." Furthermore, in the instrument of FIG. 4, the electron beam EB obliquely incident on the first multipole element 3 is deflected back to the optical axis O by the XY-deflecting field created by the magnetic poles of the first multipole element 3 (second deflection means).

While embodiments of the present invention have been described so far with reference to FIGS. 1-4, the invention is not limited thereto. For example, in the above embodiments, the $C_s$ corrector is disposed in the illumination system of a transmission electron microscope. In implementation of the present invention, a $C_s$ corrector may also be incorporated in the imaging lens system. Furthermore, in implementation of the invention, a $C_s$ corrector may be incorporated only into the imaging lens system. That is, in the instrument of FIG. 1, the $C_s$ corrector 17 may also be disposed between the objective lens 12 and the intermediate lens 13, and the electron beam EB may be tilted by the second multipole element 7 (located on the intermediate lens side) of the imaging lens system to correct the parasitic aberration $S_3$ in the same way as in the case of FIG. 1. In this case, the beam EB is deflected back to the optical axis O by the deflection coils disposed on the beam exit side of the second multipole element 7.

In the instrument of FIG. 1, a second $C_s$ corrector 17 may be disposed between the objective lens 12 and the intermediate lens 13. A deflection lens may be incorporated into this $C_s$ corrector 17. The electron beam EB may be made to obliquely hit the second multipole element 7 (located on the intermediate lens side) of the imaging lens system to correct the parasitic aberration $S_3$ in the same way as in the instrument of FIG. 3.

Furthermore, in the instrument of FIG. 1, the second $C_s$ corrector 17 may be disposed between the objective lens 12 and the intermediate lens 13. A deflection lens may be disposed between the second $C_s$ corrector 17 and the objective lens 12. The electron beam EB may be made to obliquely hit the first multipole element 3 of the imaging lens system (located on a side of the objective lens 12) to correct the parasitic aberration $S_3$ in the same way as in the case of FIG. 4.

In implementation of the present invention, if the second $C_s$ corrector is disposed in the imaging lens system of the transmission electron microscope, the parasitic aberration $S_3$ is corrected together with the spherical aberration $C_s$ in the objective lens 12. Consequently, a high-resolution TEM image can be obtained.

The present invention can be applied to electron beam equipment other than transmission electron microscopes. For example, the invention can also be applied to a scanning electron microscope or an electron beam exposure system.

Having thus described my invention with the detail and particularity required by the Patent Laws, what is desired protected by Letters Patent is set forth in the following claims.

The invention claimed is:

1. A method of correcting aberration in an electron beam system equipped with a spherical aberration corrector having transfer lenses disposed between first and second multipole elements,
wherein a center orbit of an electron beam is tilted relative to an optical axis within said first multipole element or within said second multipole element such that third-order aberration (S3) with two-fold symmetry is corrected.

2. An electron beam system equipped with a spherical aberration corrector having transfer lenses disposed between first and second multipole elements, said electron beam system comprising:
first deflection means for deflecting an electron beam such that a center orbit of the electron beam is tilted relative to an optical axis within the first multipole element or within the second multipole element; and
control means for controlling said first deflection means, the control means acting to supply a tilt control signal to said first deflection means as a control signal for correcting third-order aberration (S3) with two-fold symmetry, the tilt control signal indicating in what direction should the electron beam be tilted to what extent within the first or second multipole element.

3. An electron beam system as set forth in claim 2, wherein said first deflection means deflects the electron beam by a deflecting field created by the second multipole element such that the center orbit of the electron beam exiting from the first multipole element is tilted relative to the optical axis within the second multipole element.

4. An electron beam system as set forth in claim 3, wherein the electron beam is deflected back to the optical axis by a deflecting field created by second deflection means disposed on an exit side of the second multipole element.

5. An electron beam system as set forth in claim 2, wherein the electron beam is deflected by a deflecting field created by said first deflection means disposed between the first and second multipole elements to cause the electron beam exiting from the first multipole element to impinge on the optical axis at an angle to the optical axis passing through the second multipole element.

6. An electron beam system as set forth in claim 5, wherein the electron beam is deflected back to the optical axis by a deflecting field created by the second multipole element.

7. An electron beam system as set forth in claim 2, wherein the electron beam travels from a side of the first multipole element toward the second multipole element, and wherein the electron beam is deflected by deflection means disposed on an entrance side of the first multipole element such that the electron beam impinges on the optical axis at an angle to the optical axis passing through the first multipole element.

8. An electron beam system as set forth in claim 7, wherein the electron beam is deflected back to the optical axis by a deflecting field created by the first multipole element.

* * * * *